United States Patent
Ma et al.

(10) Patent No.: US 6,586,836 B1
(45) Date of Patent: Jul. 1, 2003

(54) PROCESS FOR FORMING MICROELECTRONIC PACKAGES AND INTERMEDIATE STRUCTURES FORMED THEREWITH

(75) Inventors: Qing Ma, San Jose, CA (US); Xiao-Chun Mu, Saratoga, CA (US); Quat Vu, Santa Clara, CA (US); Steve Towle, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/516,652

(22) Filed: Mar. 1, 2000

(51) Int. Cl.[7] .............................................. H01L 23/48
(52) U.S. Cl. ...................... 257/723; 257/686; 257/796; 257/737; 438/109
(58) Field of Search .................. 257/685, 686, 257/706, 723, 725, 737, 777, 778, 796, 679; 361/715, 716, 735, 737; 438/106, 107, 109, 108, 126

(56) References Cited

U.S. PATENT DOCUMENTS

| | | | | |
|---|---|---|---|---|
| 5,280,192 A | * | 1/1994 | Kryzaniwsky | 257/723 |
| 5,353,498 A | | 10/1994 | Fillion et al. | |
| 5,422,513 A | | 6/1995 | Marcinkiewicz et al. | |
| 5,463,253 A | * | 10/1995 | Waki et al. | 257/724 |
| 5,491,612 A | * | 2/1996 | Nicewarner, Jr. | 361/760 |
| 5,497,033 A | | 3/1996 | Fillion et al. | |
| 5,508,565 A | * | 4/1996 | Hatakeyama et al. | 257/777 |
| 5,527,741 A | | 6/1996 | Cole et al. | |
| 5,530,292 A | * | 6/1996 | Waki et al. | 257/724 |
| 5,703,400 A | | 12/1997 | Wojnarowski et al. | |
| 5,745,984 A | | 5/1998 | Cole, Jr. et al. | |
| 5,798,564 A | * | 8/1998 | Eng et al. | 257/686 |
| 5,838,061 A | * | 11/1998 | Kim | 257/686 |
| 5,861,666 A | * | 1/1999 | Bellaar | 257/686 |
| 5,883,426 A | * | 3/1999 | Tokuno et al. | 257/686 |
| 5,977,640 A | * | 11/1999 | Bertin et al. | 257/777 |
| 6,002,167 A | * | 12/1999 | Hatano et al. | 257/696 |
| 6,013,948 A | * | 1/2000 | Akram et al. | 257/698 |
| 6,072,700 A | * | 6/2000 | Nam | 361/783 |
| 6,084,294 A | * | 7/2000 | Tomita | 257/686 |
| 6,087,718 A | * | 7/2000 | Cho | 257/686 |
| 6,087,719 A | * | 7/2000 | Tsunashima | 257/686 |
| 6,091,142 A | * | 7/2000 | Lee | 257/713 |
| 6,118,184 A | * | 9/2000 | Ishio et al. | 257/787 |
| 6,133,637 A | * | 10/2000 | Hikita et al. | 257/777 |
| 6,137,162 A | * | 10/2000 | Park et al. | 257/685 |
| 6,137,163 A | * | 10/2000 | Kim et al. | 257/686 |

FOREIGN PATENT DOCUMENTS

| JP | 11045955 | 2/1999 |
|---|---|---|
| JP | 11312868 | 11/1999 |

* cited by examiner

*Primary Examiner*—Kamand Cuneo
*Assistant Examiner*—Lourdes Cruz
(74) *Attorney, Agent, or Firm*—Schwegman, Lundberg, Woessner & Kluth, P.A.

(57) ABSTRACT

A method of fabricating microelectronic dice by providing or forming a first encapsulated die assembly and a second encapsulated die assembly. Each of the encapsulated die assemblies includes at least one microelectronic die disposed in an encapsulation material. Each of the encapsulated die assemblies has an active surface and a back surface. The encapsulated die assemblies are attached together in a back surface-to-back surface arrangement. Build-up layers are then formed on the active surfaces of the first and second encapsulated assemblies, preferably, simultaneously. Thereafter, the microelectronic dice are singulated, if required, and the microelectronic dice of the first encapsulated die assembly are separated from the microelectronic dice of the second encapsulated die assembly.

26 Claims, 8 Drawing Sheets

PROCESS FOR FORMING MICROELECTRONIC PACKAGES AND INTERMEDIATE STRUCTURES FORMED THEREWITH

BACKGROUND OF THE INVENTION

1. Field of the Invention

The present invention relates to apparatus and processes for packaging microelectronic dice. In particular, the present invention relates to a packaging technology that fabricates build-up layers on an encapsulated microelectronic die and on the encapsulation material that partially covers the microelectronic die.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

As shown in FIG. 8, true CSP would involve fabricating build-up layers directly on an active surface 204 of a microelectronic die 202. The build-up layers may include a dielectric layer 206 disposed on the microelectronic die active surface 204. Conductive traces 208 may be formed on the dielectric layer 206, wherein a portion of each conductive trace 208 contacts at least one contact 212 on the microelectronic die active surface 204. External contacts, such as solder balls or conductive pins for contact with an external component (not shown), may be fabricated to electrically contact at least one conductive trace 208. FIG. 8 illustrates the external contacts as solder balls 214 where are surrounded by a solder mask material 216 on the dielectric layer 206. However in such true CSP, the surface area provided by the microelectronic die active surface 204 generally does not provide enough surface for all of the external contacts needed to contact the external component (not shown).

Additional surface area can be provided through the use of an interposer, such a substrate (substantially rigid material) or a flex component (substantially flexible material). FIG. 9 illustrates a substrate interposer 222 having a microelectronic die 224 attached to and in electrical contact with a first surface 226 of the substrate interposer 222 through small solder balls 228. The small solder balls 228 extend between contacts 232 on the microelectronic die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts are formed on the bond pads 236 (shown as solder balls 244).

The use of the substrate interposer 222 requires number of processing steps. These processing steps increase the cost of the package. Additionally, even the use of the small solder balls 228 presents crowding problems which can result in shorting between the small solder balls 228 and can present difficulties in inserting underfilling between the microelectronic die 224 and the substrate interposer 222 to prevent contamination.

FIG. 10 illustrates a flex component interposer 252 wherein an active surface 254 of a microelectronic die 256 is attached to a first surface 258 of the flex component interposer 252 with a layer of adhesive 262. The microelectronic die 256 is encapsulated in an encapsulation material 264. Openings are formed in the flex component interposer 252 by laser abalation through the flex component interposer 252 to contacts 266 on the microelectronic die active surface 254 and to selected metal pads 268 residing within the flex component interposer 252. A conductive material layer is formed over a second surface 272 of the flex component interposer 252 and in the openings. The conductive material layer is patterned with standard photomask/etch processes to form conductive vias 274 and conductive traces 276. External contacts are formed on the conductive traces 276 (shown as solder balls 278 surrounded by a solder mask material 282 proximate the conductive traces 276).

The use of a flex component interposer 252 requires gluing material layers which form the flex component interposer 252 and requires gluing the flex component interposer 252 to the microelectronic die 256. These gluing processes are relatively difficult and increase the cost of the package.

Therefore, it would be advantageous to develop new apparatus and techniques to provide additional surface area to form traces for use in CSP applications, while utilizing commercially available, widely practiced semiconductor fabrication techniques.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1a–1k and 2–7 illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

Figure 1A:
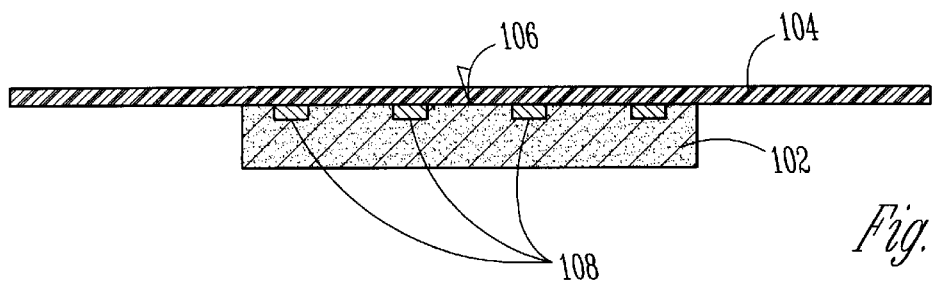
FIGS. 1a–1k are side cross-sectional views of a first embodiment of a process of forming a microelectronic package, according to the present invention.

The present invention includes a packaging technology that fabricates build-up layers on an encapsulated microelectronic die that has expanded area larger than that of the microelectronic die. FIGS. 1a–1k illustrate a first embodiment of a process of forming a microelectronic package of the present invention. As shown in FIG. 1a, a protective film 104 is abutted against an active surface 106 of a microelectronic die 102 to protect the microelectronic die active surface 106 from any contaminants. The microelectronic die active surface 106 has at least one contact 108 disposed thereon. The contacts 108 are in electrical contact with integrated circuitry (not shown) within the microelectronic die 102. The protective film 104 may have a weak adhesive, similar to protective films used in the industry during wafer dicing, which attaches to the microelectronic die active surface 106. This adhesive-type film may be applied prior to placing the microelectronic die 102 in a mold used for the encapsulation process. The protective film 104 may also be a non-adhesive film, such as a ETFE (ethylene-tetrafluoroethylene) or Teflon® film, which is held on the microelectronic die active surface 106 by an inner surface of the mold during the encapsulation process.

Figure 1B:
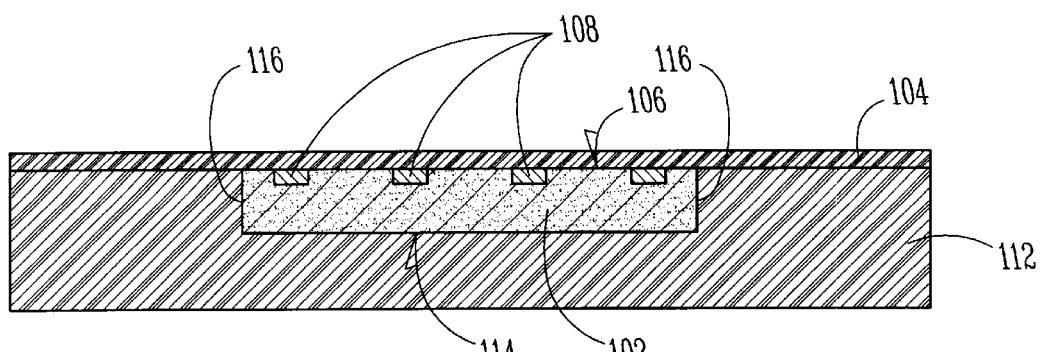

The microelectronic die 102 is then encapsulated with an encapsulation material 112, such as plastics, resins, and the like, as shown in FIG. 1b, that covers a back surface 114 and side(s) 116 of the microelectronic die 102. The encapsulation of the microelectronic die 102 may be achieved by any known process, including but not limited to injection, transfer, and compression molding. The encapsulation material 112 provides mechanical rigidity, protects the microelectronic die 102 from contaminants, and provides surface area for the build-up of trace layers.

Figure 1C:
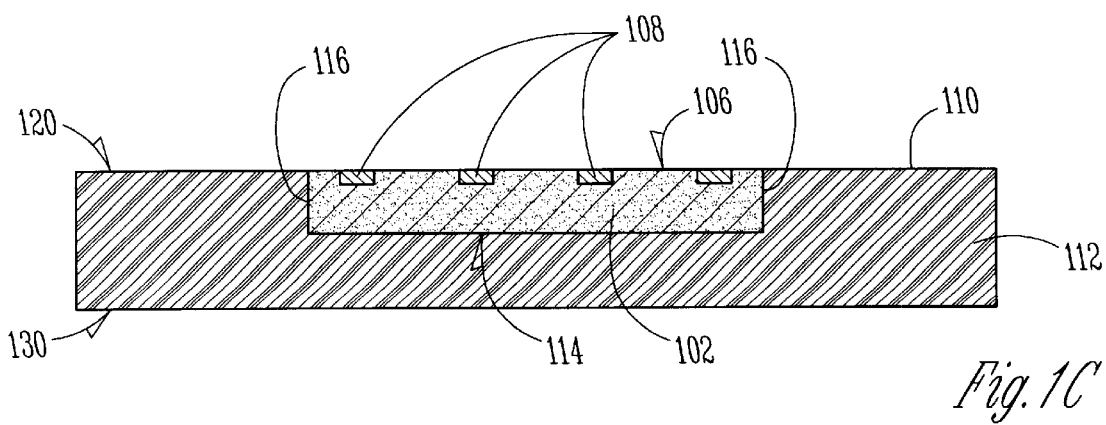

After encapsulation, the protective film 104 is removed, as shown in FIG. 1c, to expose the microelectronic die active surface 106. As also shown in FIG. 1c, the encapsulation material 112 is molded to form at least one surface 110 which is substantially planar to the microelectronic die active 106. The encapsulation material surface 110 and the microelectronic die active surface 106 constitute the active surface 120 of the encapsulated microelectronic die assembly, which will be utilized in further fabrication steps as additional surface area for the formation of build-up layers, such as dielectric material layers and conductive traces. The surface of the encapsulation material 112 which opposes encapsulation material surface 110 comprises at least a portion of a back surface 130 of the microelectronic die assembly.

Figure 1D:
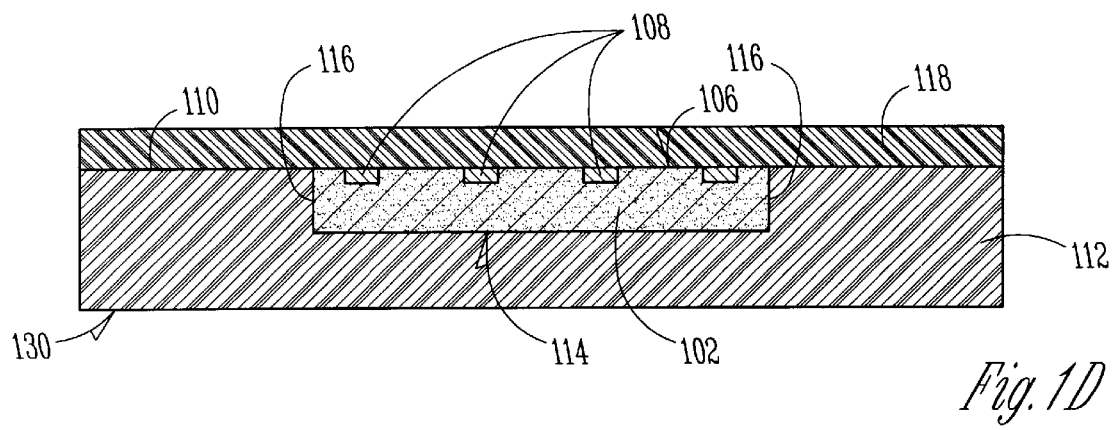

A first dielectric layer 118, such as silicon dioxide, silicon nitride, and the like, is disposed over the microelectronic die active surface 106 and the encapsulate material surface 110, as shown in FIG. 1d. The formation of the first dielectric layer 118 may be achieved by any known process, including but not limited to spin and spray-on deposition.

Figure 1E:
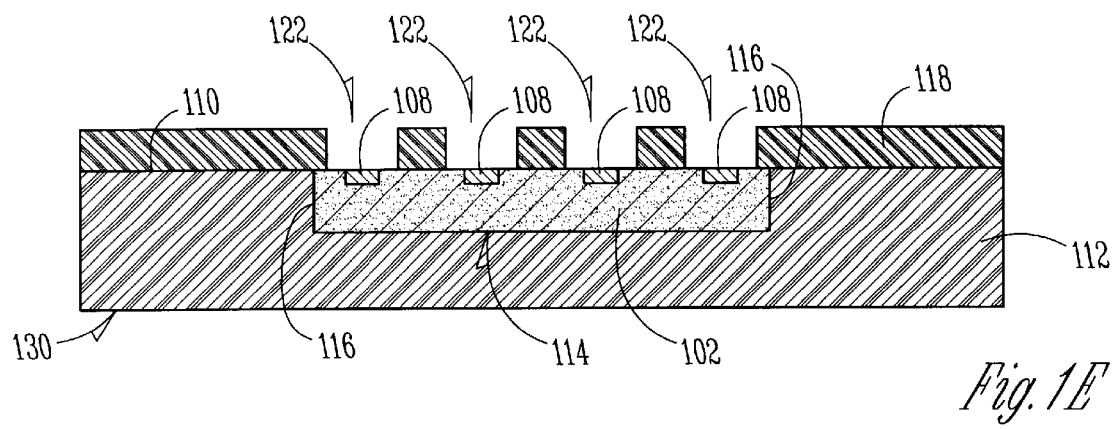

As shown in FIG. 1e, a plurality of vias 122 are then formed through the first dielectric layer 118. The plurality of vias 122 may be formed any method known in the art, including but not limited to laser drilling, photolithography, and, if the first dielectric layer 118 is photoactive, forming the plurality of vias 122 in the same manner that a photoresist mask is made in a photolithographic process, as known in the art.

Figure 1F:
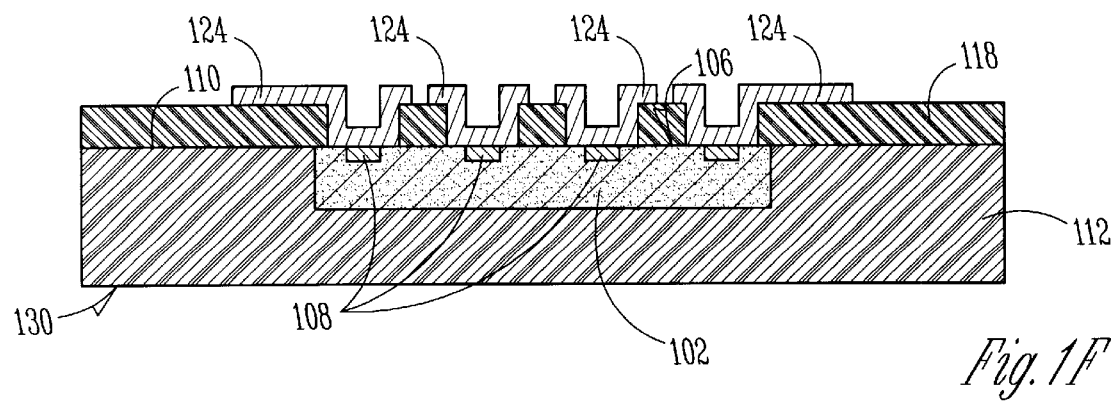

A plurality of conductive traces 124 is formed on the first dielectric layer 118, as shown in FIG. 1f, wherein a portion of each of the plurality of conductive trace 124 extends into at least one of said plurality of vias 122 to make electrical contact therewith. The plurality of conductive traces 124 may be made of any applicable conductive material, such as copper, aluminum, and alloys thereof. As shown in FIG. 1f, at least one conductive trace extends vertically adjective surface 106 and vertically adjacent said encapsulation material surface 110.

The plurality of conductive traces 124 formed by any known technique, including by not limited to photolithographic techniques. An exemplary photolithographic technique can involve forming a conformal layer of conductive material over the dielectric layer and applying a thin photoresist coating (hereinafter "photoresist") over the conductive material layer. The photoresist is photoactive, such that when exposed to light (usually ultraviolet light), the photoresist either becomes soluble (positive photoresist) or insoluble (negative photoresist) in specific solvents. Light is projected through a template that shields specific areas of the photoresist while exposing other areas, thereby translating the pattern of the template onto the photoresist. After exposure, the desired portions of the photoresist are removed by an appropriate solvent. The remaining photoresist becomes a mask that remains on the conductive material layer. The mask is used to expose areas of the conductive material layer to be etched, thereby forming the conductive traces.

Figure 1G:
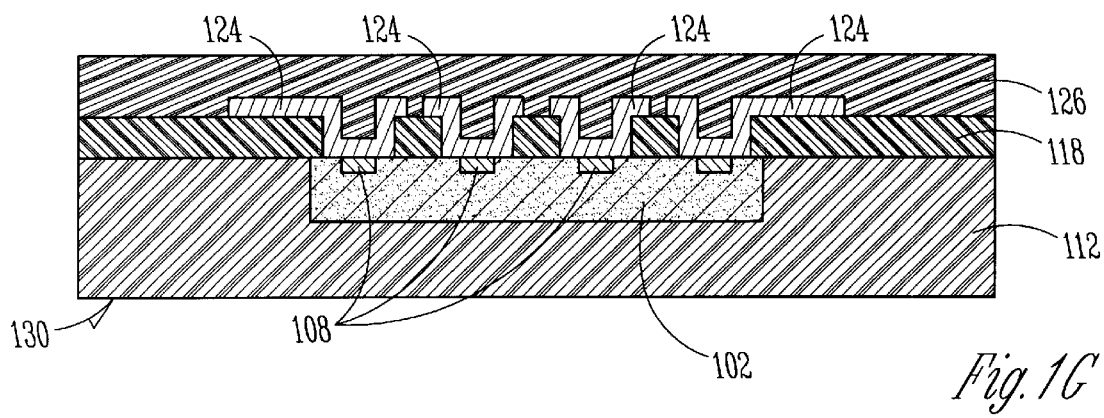

As shown in FIG. 1g, a second dielectric layer 126 is disposed over the plurality of conductive traces 124 and the first dielectric layer 118. The formation second dielectric layer 126 may be achieved by any known process, including but not limited to spin and spray-on deposition.

Figure 1H:
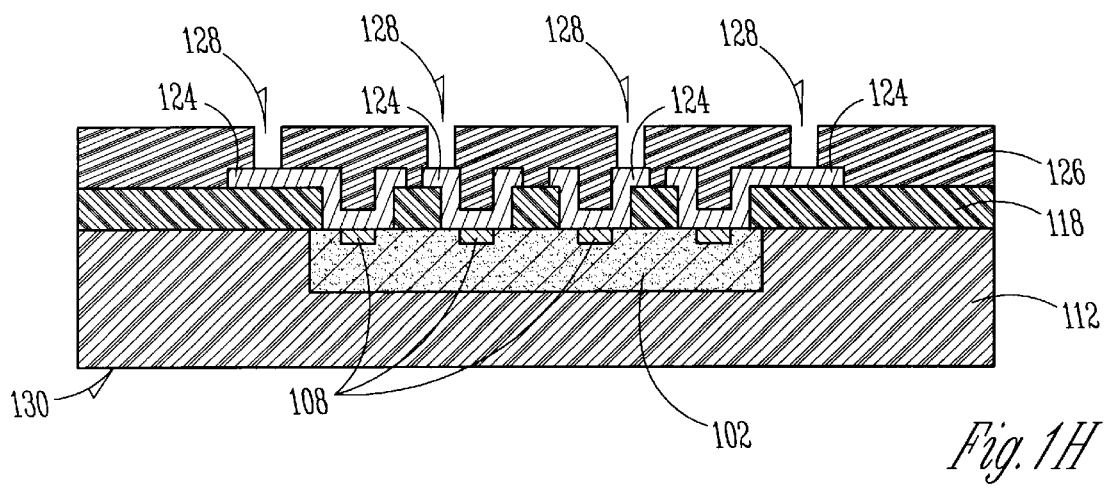

As shown in FIG. 1h, a plurality of second vias 128 are then formed through the second dielectric layer 126. The plurality of second vias 128 may be formed any method known in the art, including but not limited to laser drilling and, if the second dielectric layer 126 is photoactive, forming the plurality of second vias 128 in the same manner that a photoresist mask is made in a photolithographic process, as known in the art.

Figure 1I:
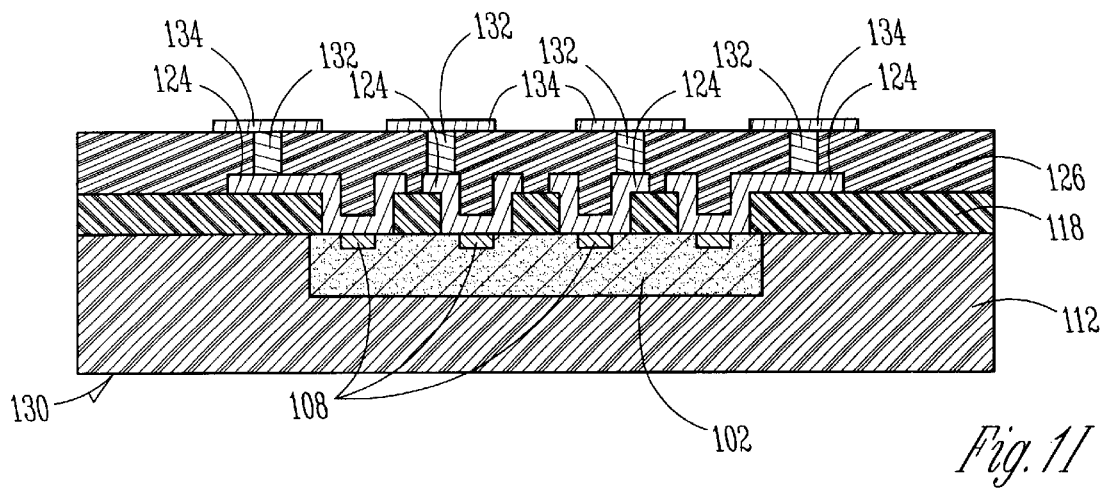
Figure 1J:
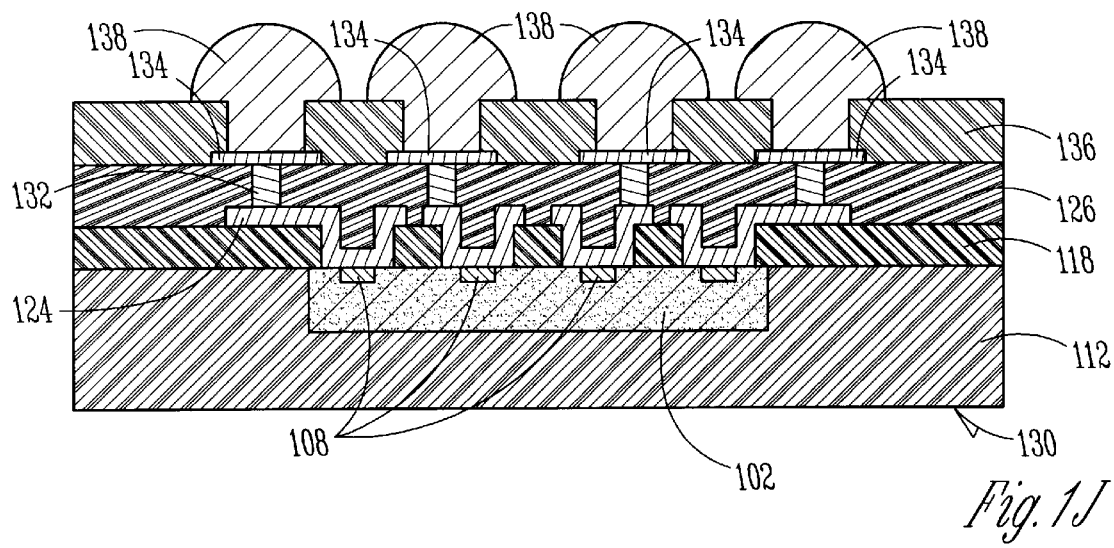
Figure 1K:
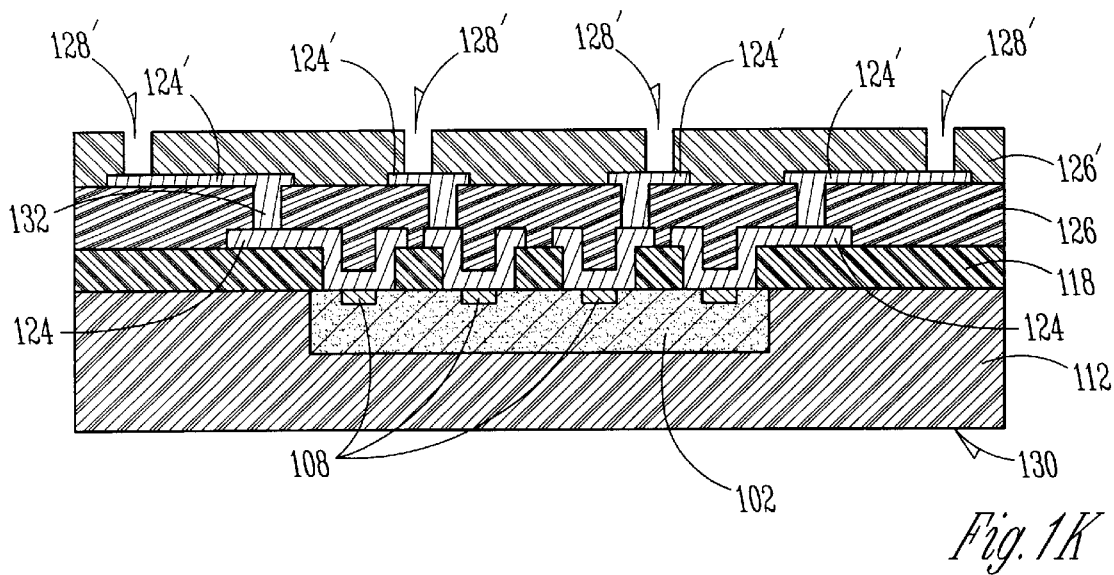

If the plurality of conductive traces 124 is not capable of placing the plurality of second vias 128 in an appropriate position, then other portions of the conductive traces are formed in the plurality of second vias 128 and on the second dielectric layer 126, another dielectric layer formed thereon, and another plurality of vias is formed in the dielectric layer, such as described in FIGS. 1f–1h. The layering of dielectric layers and the formation of conductive traces can be repeated until the vias are in an appropriate position. Thus, portions of a single conductive trace be formed from multiple portions thereof and can reside on different dielectric layers. This concept is illustrated in FIG. 1k wherein the other portions of the conductive traces are referenced as 124',the additional dielectric layer is referenced as 126', and the additional plurality of vias is referenced as 128'.

Assuming that the plurality of second vias 128 is correctly positioned (as shown in FIG. 1h), a conductive material is disposed in the plurality of second vias 128, by any known technique, to form a plurality of conductive plugs 132. A plurality of conductive pads 134 is formed on the second dielectric layer 126, wherein each of the plurality of conductive pads 134 is in discrete contact with each of the plurality of conductive plugs 132, as shown in FIG. 1i.

Once the conductive pads 134 are formed, they can be used in the formation of conductive interconnects, such as solder bumps, solder balls, pins, and the like, for communication with external components. For example, a solder mask material 136 can be disposed over the second dielectric layer 126 and the plurality of conductive pads 134. A plurality of vias is then formed in the solder mask material 136 to expose at least a portion of each of the plurality of conductive pads 134. A plurality of conductive bumps 138, such as solder bumps, can be formed, such as by known plating techniques, on the exposed portion of each of the plurality of conductive pads 134, as shown in FIG 1j.

Figure 2:
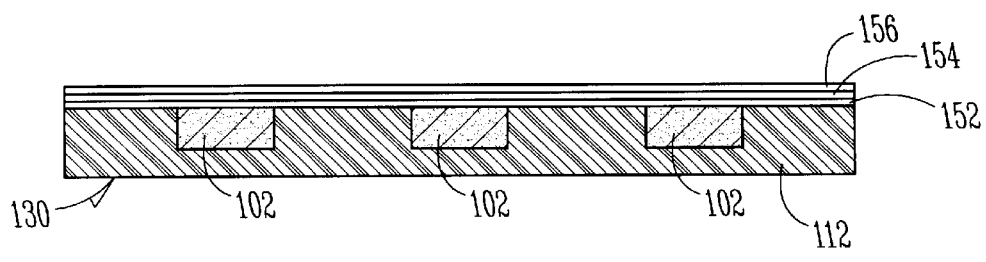
FIG. 2 is a side cross-sectional view of an embodiment of a microelectronic assembly that des a plurality of microelectronic dice, according to the present invention.
Figure 3:
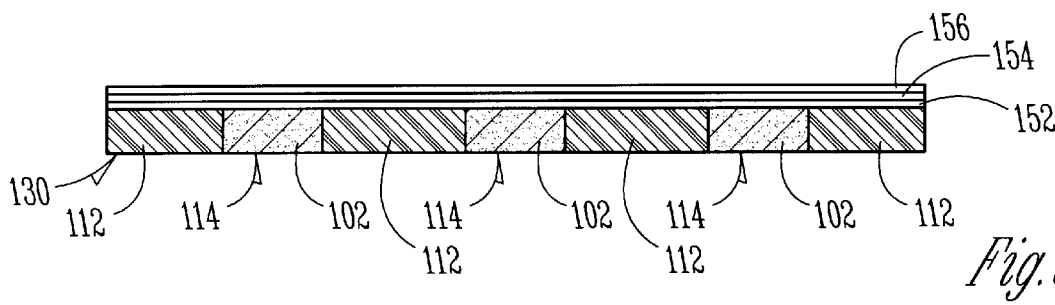
FIG. 3 is a side cross-sectional view of another embodiment of a microelectronic assembly that includes a plurality of microelectronic dice, according to the present invention.
Figure 4:
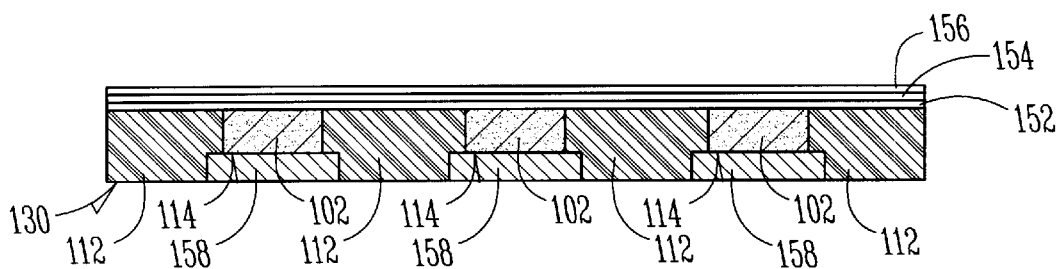
FIG. 4 is a side cross-sectional view of still another embodiment of a microelectronic assembly that includes a plurality of microelectronic dice, according to the present invention.

FIG. 2 illustrates another embodiment of the present invention wherein a plurality of microelectronic dice 102 are simultaneously encapsulated in the encapsulation material 112. The build-up layers of dielectric material and conductive element are simply represented as first build-up layer 152, second build-up layer 154, and third build-up layer 156 without illustrating the detail shown in FIGS. 1a–1k. It is, of course, understood that the microelectronic dice 102 could be encapsulated such that the microelectronic die back surfaces 114 are exposed, such that heat dissipation devices may be subsequently attached thereto, as shown in FIG. 3. Furthermore, as shown in FIG. 4, heat dissipation devices, such as heat slugs 158, could be thermally attached to the microelectronic die back surface 114, preferably with a thermally conductive adhesive (not shown), and encapsulated with the encapsulation material 112. With the structures as shown in FIGS. 2–4, the individual microelectronic dice 102 are generally separated from one another in a singulation process (i.e., cutting through the encapsulation material 112 between the microelectronic dice 102).

Although the build-up layer techniques described of FIGS. 1a–1k and 2–4 have many advantages, warpage induced by CTE (coefficient of thermal expansion) mismatch between the encapsulation material 112 and the dielectric layers (e.g., see dielectric layer 118 and 126 of FIGS. 1e–1i) used in the build-up layers can be significant. In general, the CTE of the dielectric layers is much larger than the CTE of the encapsulation material 112 (and microelectronic die 102). The dielectric layers are generally cured at elevated temperatures, which can result in the development of significant warpage when the assembly is cooled down. This warpage causes problems in subsequent processing steps. Thus, the following process has been developed to greatly reduce or substantially eliminate the warpage problem.

Figure 5A:
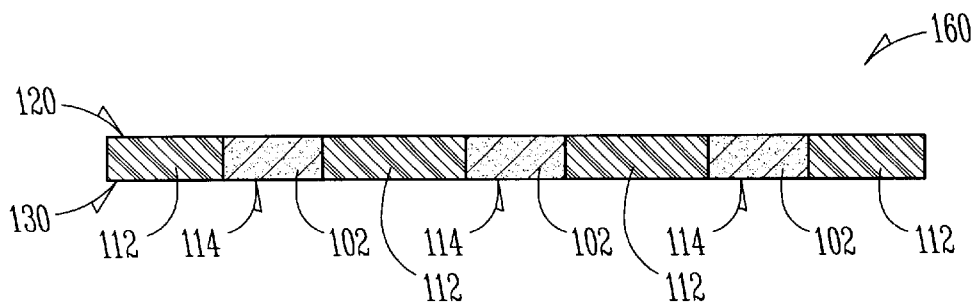
FIGS. 5a–5c are side cross-sectional views of a layering method for forming microelectronic packages, according to the present invention.
Figure 5B:
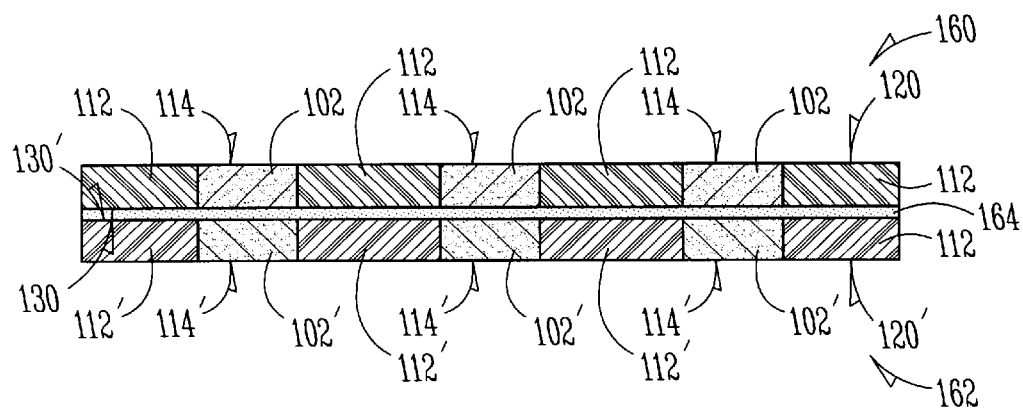

As shown in FIG. 5a, a first encapsulated die assembly 160 is provided. The first encapsulated die assembly 160 has a plurality of microelectronic dice 102 encapsulated in an encapsulation material 112 (similar to the structure shown in FIG. 3 without the build-up layers). As shown in FIG. 5b, a second encapsulated die assembly 162, which is similar to configuration of the first encapsulated die assembly 160, is attached to the first encapsulated die assembly 160. As with the first encapsulated die assembly 160, the second encapsulated die assembly 162 also has a plurality of microelectronic dice 102'encapsulated in an encapsulation material 112'. The first encapsulated die assembly 160 and the second encapsulated die assembly 162 are oriented such that the first encapsulated microelectronic die assembly back surface 130 faces the second encapsulated microelectronic die back surface 130'.

Figure 6:
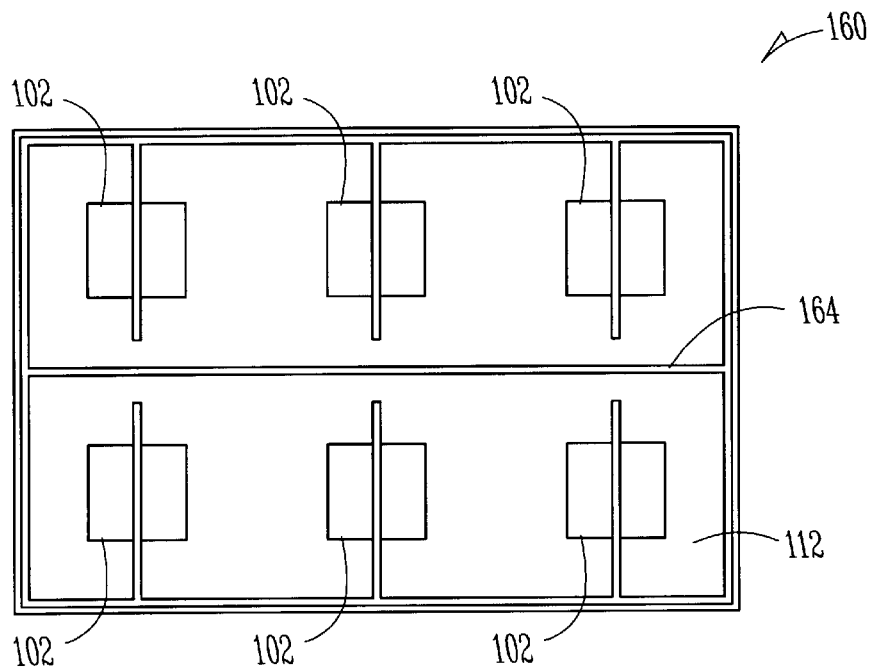
FIG. 6 is a top plan view of a patterned adhesive layer on a microelectronic assembly, according to the present invention.

The first encapsulated die assembly 160 and the second encapsulated die assembly 162 are preferably attached together with a layer of adhesive 164. In one embodiment, the adhesive layer 164 comprises a weak, easily removable adhesive, such as silicone-or acrylic-based material. In another embodiments, the adhesive layer 164 comprises a sol-gel material that becomes porous and brittle after drying so that debonding is achieved by fracturing the sol-gel material. In a further embodiment, the adhesive layer 164 comprises a dissolvable adhesive, wherein the adhesive dissolves in an appropriate solvent (e.g., water, alcohol, etc.). When a dissolvable adhesive is used, the adhesive layer 164 can be pattern to allow a solvent to more easily flow between the first encapsulated die assembly 160 and the second encapsulated die assembly 162 to more quickly dissolve the adhesive layer 164. FIG. 6 illustrates such a patterned adhesive layer 164 on the first encapsulated die assembly 160.

Figure 7:
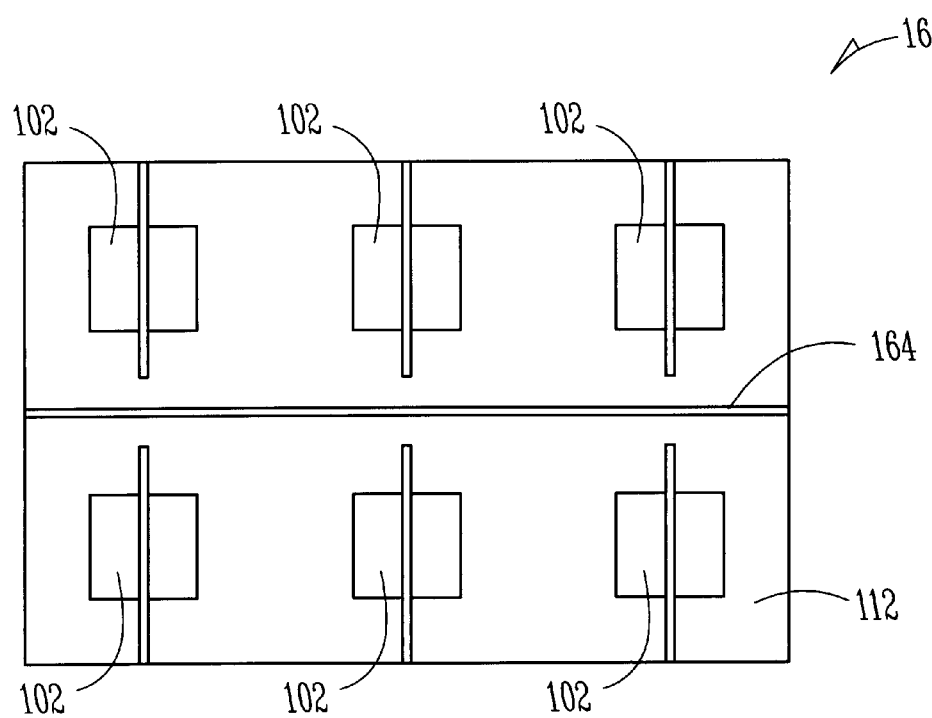
FIG. 7 is a top plan view of an alternate patterned adhesive layer on a microelectronic assembly, according to the present invention.
Figure 8:
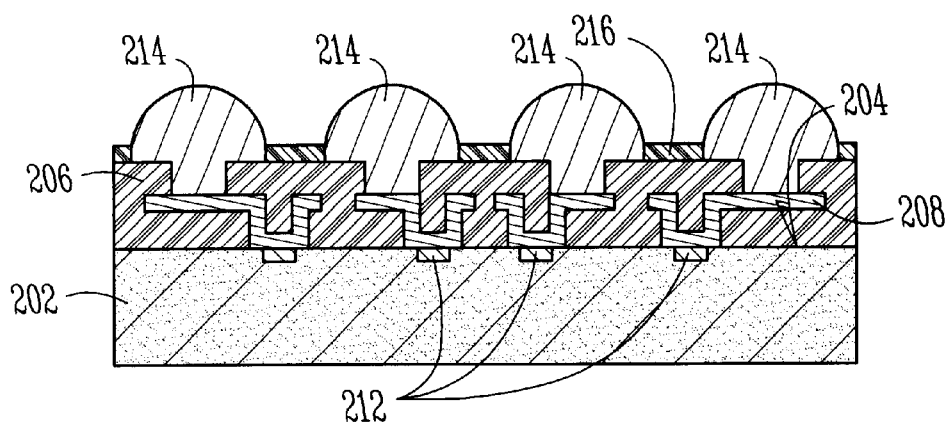
FIG. 8 is a cross-sectional view of a true CSP of a microelectronic device, as known in the art.
Figure 9:
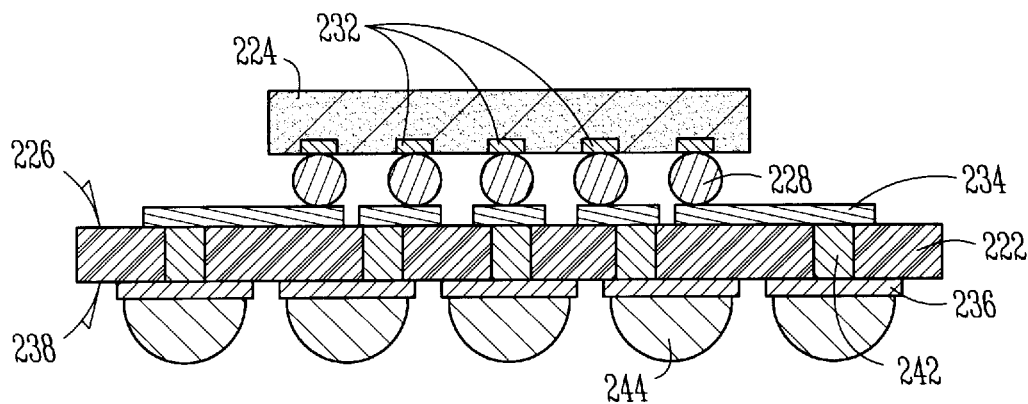
FIG. 9 is a cross-sectional view of a CSP of a microelectronic device utilizing a substrate interposer, as known in the art.
Figure 10:
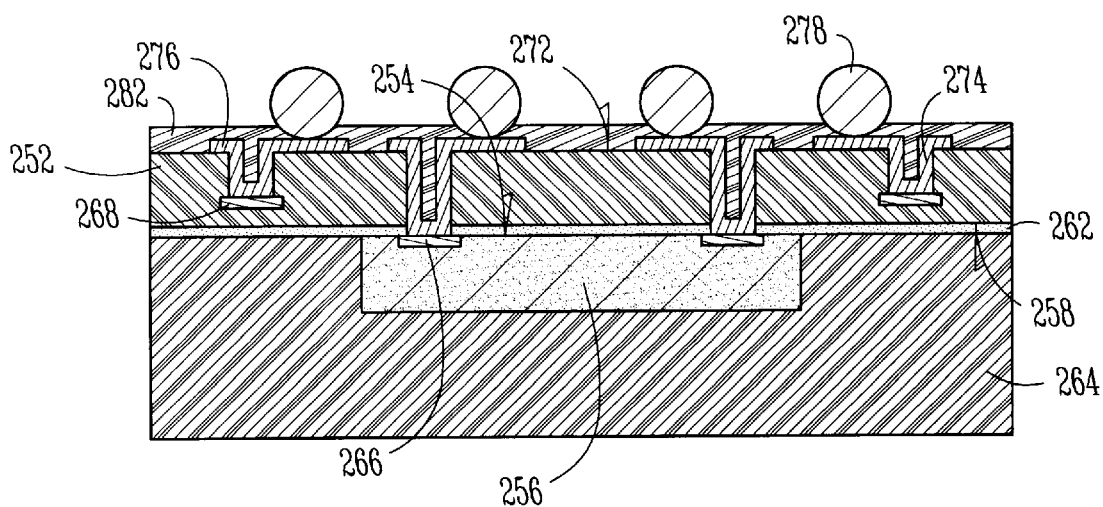
FIG. 10 is a cross-sectional view of a CSP of a microelectronic device utilizing a flex component interposer, as known in the art.

It is, of course, understood that a strong adhesive could be used as the adhesive layer 164. As shown in FIG. 7, the strong adhesive layer 164 is patterned directly in a position where a dicing saw will cut the first encapsulated die assembly 160 and the second encapsulated die assembly 162 during a subsequent singulation process. Thus, the adhesive layer 164 is also removed during the singulation process.

Figure 5C:
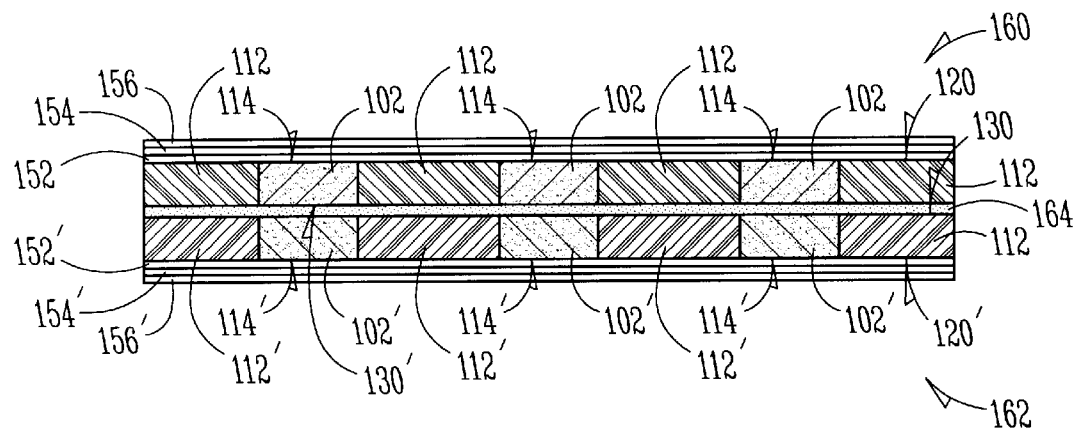

Referring again to FIG. 5b, once the first encapsulated die assembly 160 and the second encapsulated die assembly 162 are adhered together, build-up layers can be formed on a first encapsulated microelectronic die assembly active surface 120 and on a second encapsulated microelectronic die assembly active surface 120', as sh own in FIG. 5c. The build-up layers of dielectric material and conductive element are simply represented as first build-up layer 152, second build-up layer 154, and third build-up layer 156 on the first encapsulated die assembly 160 and as first build-up layer 152', second build-up layer 154', and third build-up layer 156' without illustrating the detail shown in FIGS. 1a–1k. It is, of course, understood that the build-up layers can be formed simultaneously on the first encapsulated die assembly 160 and the second encapsulated die assembly 162.

Due to "back-to-back" attachment of the first encapsulated die assembly 160 and the second encapsulated die assembly 162, any tendency for warpage occurring in the first encapsulated die assembly 160 will be counteracted by a substantially equal but opposite tendency for warpage occurring in the second encapsulated die assembly 162, which greatly reduces or substantially eliminates the warpage problem. Furthermore, the ability to form the build-up layers (and potentially other process steps) simultaneously improves the efficiency of microelectronic die fabrication process.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An intermediate microelectronic package, comprising:
   a first encapsulated die assembly having an active surface and a back surface, said first encapsulated die assembly including at least one first microelectronic die having an active surface and at least one side and a first encapsulation material adjacent said at least one first microelectronic die side, wherein said first encapsulation material comprises at least a portion of said first encapsulated die assembly back surface; and
   a second encapsulated die assembly having an active surface and a back surface, wherein said second encapsulated die assembly back, surface is attached to said first encapsulated die assembly back surface, said second encapsulated die assembly including at least one second microelectronic die having an active surface and at least one side and a second encapsulation material adjacent said at least one second microelectronic die side, wherein said second encapsulation material comprises at least a portion of said second encapsulated die assembly back surface.

2. The intermediate microelectronic package of claim 1, wherein said first encapsulated die assembly active surface comprises said at least one first microelectronic die active surface and at least one surface of said first encapsulation material which is substantially planar to said first microelectronic die active surface.

3. The intermediate microelectronic package of claim 1, wherein said second encapsulated die assembly active surface comprises said at least one second microelectronic die active surface and at least one surface of said second encapsulation material which is substantially planar to said first microelectronic die active surface.

4. The intermediate microelectronic package of claim 1, further including at least one layer of dielectric material disposed over said first encapsulated die assembly active surface and at least one conductive trace extending through and residing on said at least one dielectric material layer.

5. The intermediate microelectronic package of claim 1, further including at least one layer of dielectric material disposed over said second encapsulated die assembly active surface and at least one conductive trace extending through and residing on said at least one dielectric material layer.

6. The intermediate microelectronic package of claim 1, further including an adhesive material disposed between said first encapsulated die assembly back surface and second encapsulated die assembly back surface.

7. A method of fabricating microeletronic dice, comprising:
providing a first encapsulated die assemble having an active surface and a back surface, said first encapsulated die assembly including at least one first microelectronic die having an active surface and at least one side and a first encapsulation material adjacent said at least one first microelectronic die side, wherein said first encapsulation material comprises at least a portion of said first encapsulated die assembly back surface; and
providing a second encapsulated die assembly having an active surface and a back surface, said second encapsulated die assembly including at least one second microelectronic die having an active surface and at least one side and a second encapsulation material adjacent said at least one second microelectronic die side, wherein said second encapsulation material comprises at least a portion of said second encapsulated die assembly back surface; and
attaching said first encapsulated die assembly back surface to said second encapsulated assembly back surface.

8. The method of claim 7, further including forming at least one layer of dielectric material over said first encapsulated die assembly active surface.

9. The method of claim 8, further including forming at least one conductive trace extending through and residing on said at least one dielectric material layer.

10. The method of claim 7, further including forming at least one layer of dielectric material over said second encapsulated die assembly active surface.

11. The method of claim 10, further including forming at least one conductive trace extending through and residing on said at least one dielectric material layer.

12. The method of claim 7, further including simultaneously forming at least one layer of dielectric material over said first encapsulated die assembly active surface and at least one layer of dielectric material over said second encapsulated die assembly active surface.

13. The method of claim 12, further including simultaneously forming at least one conductive trace extending through and residing on said at least one dielectric material layer on said first encapsulated die assembly and at least one conductive trace extending through and residing on said at least one dielectric material layer on said second encapsulated die assembly.

14. The method of claim 7, wherein said attaching said first encapsulated die assembly back surface to said second encapsulated assembly back surface comprises disposing an adhesive on said first encapsulated die assembly back surface and contacting said second encapsulated assembly back surface with said adhesive.

15. The method of claim 14, wherein said disposing an adhesive on said first encapsulated die assembly back surface comprises patterning said adhesive on said first encapsulated die assembly back surface.

16. The method of claim 7, wherein said providing a first encapsulated die assembly comprises:
providing at least one first microelectronic die having an active surface and at least one side;
abutting a protective film against said at least one first microelectronic die active surface;
encapsulating said at least one microelectronic die with an encapsulation material adjacent said at least one first microelectronic die side, wherein said encapsulation material provides at least one surface of said encapsulation material substantially planar to said first microelectronic die active surface; and
removing said protective film.

17. The method of claim 7, wherein said providing a second encapsulated die assembly comprises:
providing at least one second microelectronic die having an active surface and at least one side;
abutting a protective film against said at least one second microelectronic die active surface;
encapsulating said at least one microelectronic die with an encapsulation material adjacent said at least one second microelectronic die side, wherein said encapsulation material provides at least one surface of said encapsulation material substantially planar to said second microelectronic die active surface; and
removing said protective film.

18. A method of fabricating a microelectronic package, comprising: forming a first encapsulated die assembly comprising:
providing at least one first microelectronic die having an active surface and at least one side;
abutting a protective film against said at least one first microelectronic die active surface; and
encapsulating said at least one microelectronic die with an encapsulation material adjacent said at least one first microelectronic die side to form a first encapsulated die active surface and a first encapsulated die back surface;
forming a second encapsulated die assembly comprising:
providing at least one second microelectronic die having an active surface and at least one side;

abutting a protective film against said at least one second microelectronic die active surface; and encapsulating said at least one microelectronic die with an encapsulation material adjacent said at least one second microelectronic die side to form a second encapsulated die active surface and a second encapsulated die back surface; and attaching said first encapsulated die assembly back surface to said second encapsulated assembly back surface.

19. The method of claim 18, further including forming at least one layer of dielectric material over said first encapsulated die assembly active surface.

20. The method of claim 18, further including forming at least one conductive trace extending through and residing on said at least one dielectric material layer.

21. The method of claim 18, further including forming at least one layer of dielectric material over said second encapsulated die assembly active surface.

22. The method of claim 18, further including forming at least one conductive trace extending through and residing on said at least one dielectric material layer.

23. The method of claim 18, further including simultaneously forming at least one layer of dielectric material over said first encapsulated die assembly active surface and at least one layer of dielectric material over said second encapsulated die assembly active surface.

24. The method of claim 23, further including simultaneously forming at least one conductive trace extending through and residing on said at least one dielectric material layer on said first encapsulated die assembly and at least one conductive trace extending through and residing on said at least one dielectric material layer on said second encapsulated die assembly.

25. The method of claim 18, wherein said attaching said first encapsulated die assembly back surface to said second encapsulated assembly back surface comprises disposing an adhesive on said first encapsulated die assembly back surface and contacting said second encapsulated assembly back surface with said adhesive.

26. The method of claim 25, wherein said disposing an adhesive on said first encapsulated die assembly back surface comprises patterning said adhesive on said first encapsulated die assembly back surface.

\* \* \* \* \*